United States Patent [19]

Nguyen et al.

[11] Patent Number: 5,109,176
[45] Date of Patent: Apr. 28, 1992

[54] MOUNTING FOR MULTIPLE CRYSTAL FILTER BLANKS

[75] Inventors: Tuan K. Nguyen; Thomas J. Rollins, both of Boca Raton; Charles W. Snyder, Boynton Beach; Charles W. Mooney, Lake Worth, all of Fla.

[73] Assignee: Motorola, Inc., Schaumburg, Ill.

[21] Appl. No.: 614,419

[22] Filed: Nov. 16, 1990

[51] Int. Cl.⁵ ............................................. H01L 41/08
[52] U.S. Cl. ................................. 310/348; 310/342; 310/344
[58] Field of Search ..................... 310/342, 344, 348; 333/186–190

[56] References Cited

U.S. PATENT DOCUMENTS

| | | | |
|---|---|---|---|
| 2,321,358 | 6/1943 | Bokovoy | 310/348 |
| 2,771,561 | 11/1956 | Fuller | 310/348 |
| 2,927,285 | 3/1960 | Curran et al. | 310/342 X |
| 3,073,975 | 1/1963 | Bigler et al. | 310/344 |
| 3,596,212 | 7/1971 | Pinner et al. | 310/348 |
| 4,112,324 | 9/1978 | Yamaguchi et al. | 310/342 X |
| 4,317,059 | 2/1982 | Besson | 310/342 X |

FOREIGN PATENT DOCUMENTS 435584  11/1974  U.S.S.R. ..................... 333/189

*Primary Examiner*—Mark O. Budd
*Attorney, Agent, or Firm*—Daniel R. Collopy; Vincent B. Ingrassia; William E. Koch

[57] ABSTRACT

Two or more crystal filter blanks are mounted together in such a manner so as to minimize the printed circuit board surface area occupied by their aggregate footprint and to minimize the vibratory and oscillatory interference among the cyrstal filters. Mounting devices are coupled to a first nonvibratory node and a second nonvibratory node of the crystal blanks to minimize vibrational and oscillatory interference between the crystal filters. Insulating material is disposed between the crystal blanks for electrically insulating and physically separating the crystal blanks from each other to additionally minimize electrical and vibrational interference between the crystal blanks.

7 Claims, 2 Drawing Sheets

MOUNTING FOR MULTIPLE CRYSTAL FILTER BLANKS

FIELD OF THE INVENTION

This invention relates in general to mounting crystal filter blanks, and in particular to mounting multiple crystal filter blanks in a single housing.

BACKGROUND OF THE INVENTION

Many communication devices operating on radio frequencies use crystal filters for improving channel selectivities. The crystals are housed in a manner which allows the crystal to vibrate yet firmly hold the crystal in place to prevent crystal damage or breakage. Crystal filters are often used in sets constituting multiple pole crystal filter systems. Many communication devices today use a four-pole crystal filter. A four-pole crystal filter can be constructed using a single filter blank and tapping four poles therefrom. Yet, the tapping of more than two-poles is expensive and not always reliable. Therefore, conventionally, a four-pole crystal filter comprises two two-pole crystal filters mounted on a printed circuit board and coupled in series. The printed circuit board real estate, though, is a valuable commodity, particularly if the communications device is portable making it desirable to minimize the size of the device. Furthermore, multiple crystal filters increases the device's component count and increases the opportunity for operational failure due to a component defect.

Thus, what is needed is a crystal filter package which would allow for mounting of two or more crystal filters in the same housing in a manner that would minimize the printed circuit board surface area occupied by the footprint of the multiple crystal blanks system, yet minimizing oscillatory interference between the crystals.

SUMMARY OF THE INVENTION

In carrying out the objects of the present invention in one form, there is provided two crystal blanks, each having a first metalization layer on a first surface and a second metalization layer on a second surface, the second surface formed opposite and parallel to the first surface. Each of the two crystal blanks also has a first node and a second node. Contact with the crystal blank at either the first node or the second node minimizes vibrational interference with the crystal blank. A mounting device is coupled to the first and second nodes of the first crystal blank for mounting the first crystal blank. Likewise, a second mounting device is coupled to the first and second nodes of the second crystal blank for mounting the second crystal blank. Insulating material is disposed between the first crystal blank and the second crystal blank for electrically insulating and physically separating the first crystal blank from the second crystal blank to minimize electrical and vibrational interference between the two crystal blanks.

DETAILED DESCRIPTION OF THE INVENTION

Figure 1:
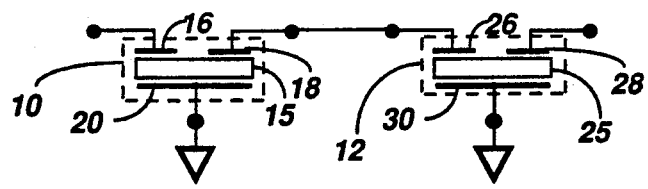
FIG. 1 is a schematic diagram of the serially connected crystal blanks.

Referring to FIG. 1, a schematic of a four-pole crystal filter system according to the preferred embodiment of the present invention comprises two two-pole crystals 10 and 12 coupled in series. The crystal 10 comprises a crystal blank 15 with a first electrical connection 16 to a first pole or metalization layer of the crystal blank 15 and an electrical connection 18 to a second pole or metalization layer of the crystal blank 15. The crystal blank 15 is also grounded by an electrical connection 20 coupled to ground. Likewise, the crystal 12 comprises a crystal blank 25 with electrical connections 26 and 28 to a first and a second metalization layer of the crystal blank 25, respectively, and an electrical connection 30 to ground. The second pole of the crystal 10 is coupled to the first pole of the crystal 12, thereby coupling the two two-pole crystals 10, 12 in series.

Figure 2:
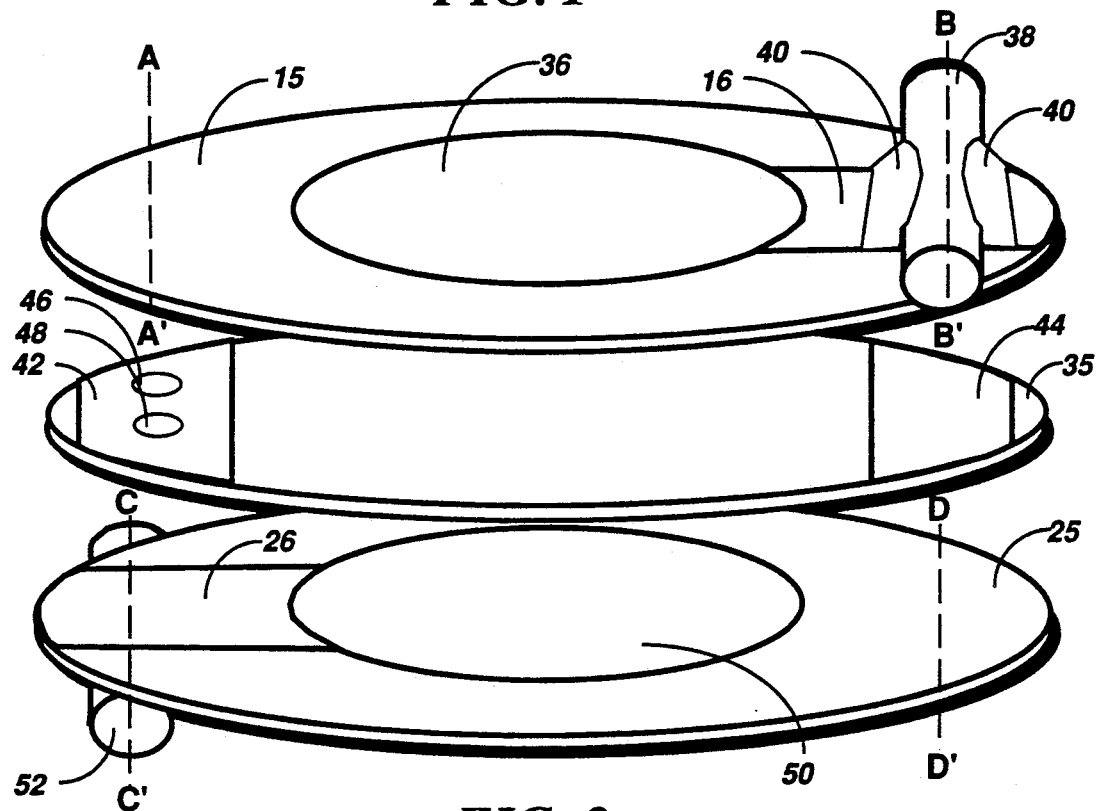
FIG. 2 is a side perspective view of two crystal blanks electrically and physically coupled according to the present invention.

Referring next to FIG. 2, a layered perspective of the present invention shows crystal blanks 15 and 25 with an insulative partition 35 located therebetween.

Axis A-A' and B-B' are nodes located on the crystal blank 15. When the crystal 15 vibrates, the nodes A-A' and B-B' minimally vibrate. Likewise, axis C-C' and D-D' indicate nodes of the crystal blank 25. A metalization layer 36 is located on the upper side of the crystal blank 15. The metalization layer 36 is coupled to the electrically conductive material 16 which in turn is coupled to an electrical lead 38 bonded to the conductive material 16 by electrically conductive bonding material 40 to provide electrical connection to the first pole of the crystal blank 15.

The partition 35 comprises electrically conductive material 42 and 44 disposed on the upper surface of the insulative partition 35 in such a manner as to be wide enough to be directly below the nodes of the crystal blank 15 and directly above the nodes of the crystal blank 25. Through holes or via holes 46, 48 provide for electrically coupling the crystal blank 15 to the crystal blank 25 through the insulative partition 35. The present invention could alternately be used for mounting two noncoupled crystal blanks. In the alternate, non-coupled embodiment, there would be no through holes 46, 48.

The crystal blank 25 has a metalization layer 50 disposed thereupon with electrically conductive material 26 to provide for connection of the first pole of the crystal blank 25 to the second pole of the crystal blank 15. A lead 52 is shown disposed towards the second surface of the crystal blank 25.

Figure 3:
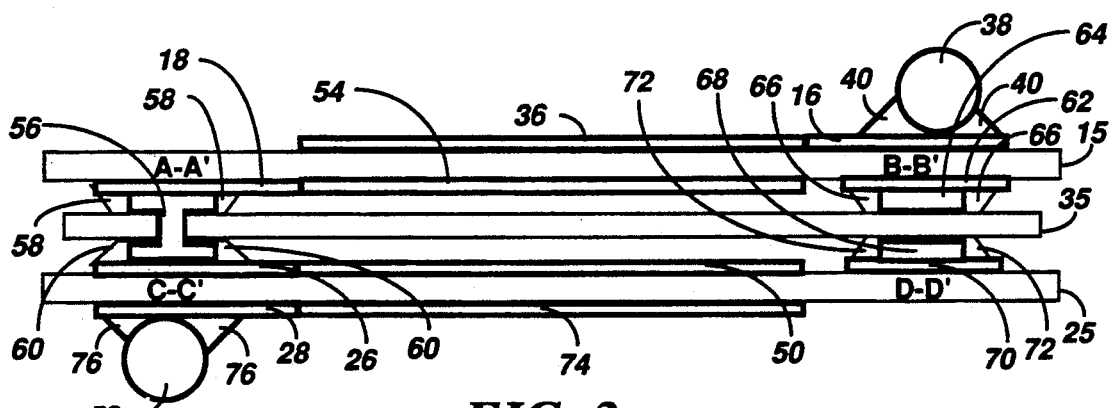
FIG. 3 is a side layered view of the two crystal blanks coupled according to the preferred embodiment of the present invention.

Referring to FIG. 3, the construction of the preferred embodiment of the present invention with the layers of construction is depicted. Lead 38 is electrically coupled and physically bonded to the conductive material 16 by bonding material 40. The electrically conductive material 16 is electrically coupled to the metalization layer 36 coupled to the first pole of the crystal blank 15. A metalization layer 54 is coupled to the second pole of the crystal blank 15 and is electrically coupled to the conductive material 18 to form an electrical connection therebetween. An electrically conductive separator 56 provides for electrical interconnection between conductive material 18 and conductive material 26 while maintaining separation between crystal blank 15, the separator 35 and the crystal blank 25 to firmly hold the crystal blanks 15 and 25 in place while allowing the crystal blanks 15 and 25 to vibrate freely as the conductive separator 56 is located over node C and below node A of the crystal blank 15. Electrically bonding material 58 and 60 maintain firm physical interconnection between the separators 56 and the various layers in order to more firmly hold the crystal blanks 15 and 25 in place to prevent damage or breakage. The separator 56 is electrically coupled to the material 26 which, in turn, is electrically coupled to the metalization layer 50 coupled to the first pole of the crystal blank 25. Spacing material 62 and 64 are located between the crystal blank 15 and the separator 35 and under the node B of the crystal blank 15 and bonded there between by bonding material 66 to form a firm physical coupling maintaining equal separation between the separator 35 and the crystal blank 15 to firmly hold the crystal blank 15 in place while not interfering with the vibration thereof. Likewise, separators 68 and 70 are disposed over the node D of the crystal blank 25 and, as bonded by the bonding material 72, maintained constant separation between the separator 35 and the crystal blank 25 without interfering with the vibration of the crystal blank 25. A metalization layer 74 is coupled to the second pole of the crystal blank 25 and is electrically coupled to connector 28. The connector 28 is coupled to the lead 52 by physical contact therebetween and by the bonding of lead 52 to the connector 28 by electrically conductive bonding material 76.

Thus, the metalization layers coupled to the poles of the crystal blanks are electrically coupled in series between the leads 38 and 52. Physical separation is maintained by spacers 56, 64, and 68 between nodes A and C and nodes B and D, respectively. In this manner, the two crystal blanks 15 and 25 are mounted together, firmly held in place to prevent damage or breakage to the crystal blanks 15 and 25 while allowing dual mounting without interference to the vibration of the crystal. For multiple crystal mounting, separators could be provided between the layers of crystal blanks and each could be interconnected and bonded by locating small spacers therebetween. Electrical interconnection of the multiple mounted crystal blanks could be provided on however needed.

Figure 4:
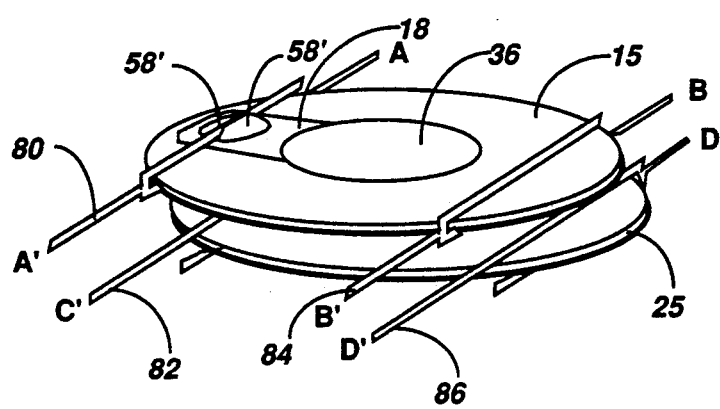
FIG. 4 is a side perspective view of an alternate embodiment of the two coupled crystal blanks.

Referring next to FIG. 4, an alternate embodiment of the present invention is depicted using mounting prongs such as those conventionally used for single crystal filter lank mounting. Prongs 80 and 84 are located over nodal axes A-A' and B-B' of the crystal filter blank 15, respectively. Likewise, prongs 82 and 86 are located over nodal axis C-C' and D-D', respectively, of the crystal filtere blank 25. The prongs 80, 82, 84 and 86 are bonded to the crystal blanks 15 and 25 to hold the crystal blanks firmly in place. For example, the prong 80 is physically and electrically bonded to the electrically conductive material 18 by the bonding material 58'.

Figure 5:
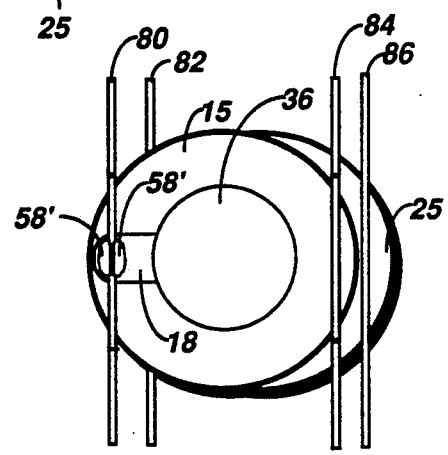
FIG. 5 is a top perspective view of the alternate embodiment arrangement of the two coupled crystal blanks.

Referring to FIG. 5, a second view of the alternate embodiment is depicted showing prongs 80, 82, 84 and 86 for mounting the crystal blanks 15 and 25. The metalization layer 36 and the conductive material 18 electrically couple the first pole of the crystal blank 15 to the pronged lead 80, which is held in place by the electrically conductive bonding material 58'.

Figure 6A:
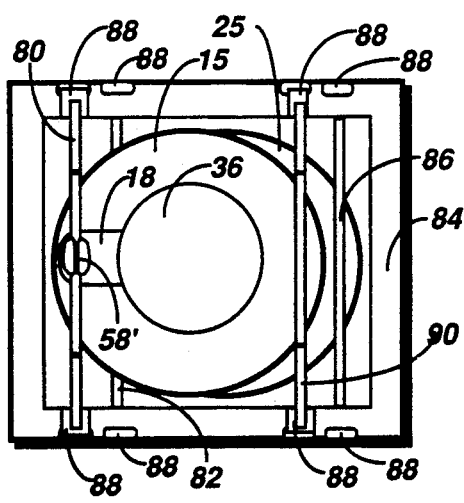
FIGS. 6A and 6B are two views (a top view FIG. 6A and a side view FIG. 6B) of the coupled crystal filter blanks in the alternate arrangement including the housing.
Figure 6B:
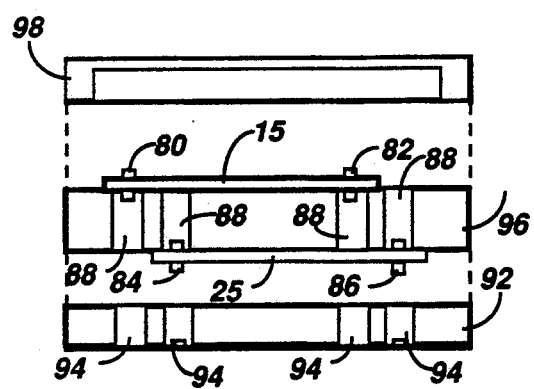

Referring next to FIGS. 6A and 6B, separation between the crystal blanks 15 and 25 is maintained by nonconductive material formed in the shape of a box which can receive the ends of the prongs 80, 82, 84 and 86. In the top view (FIG. 6A), the prongs 80 and 82 are shown laying within recesses of the box 90. Electrical interconnection between the prongs would allow for coupling the crystal blanks in series or parallel. The side view (FIG. 6B), shows that the box 90 is composed of a first portion 92 forming the base of the box 90. Connections to additional components would be made through the through or via holes 94 in the bottom of the container 92. The middle portion 96 of the box 90 receives the prongs of the filter blanks 15 and 25 on the top and the bottom, respectively. A lid 98 completes the box 90 thereby protecting the crystal blanks mounted therein and firmly mounting the crystal blanks 15 and 25 utilizing the prongs 80, 82, 84, and 86 while allowing for free vibration of the crystal blanks, electrical interconnection therebetween, and firm physical mounting of the crystal blank.

By now it should be appreciated that there has been provided a crystal filter package which would allow for mounting of two or more crystal filters in the same housing minimizing the printed circuit board surface area occupied by the footprint of the crystal filter system, yet minimizing oscillatory interference between the crystal filters.

We claim:

1. An apparatus for mounting a first crystal blank and a second crystal blank, each having a first nonvibrating node and a second nonvibrating node located thereon and each having a first surface and a second surface located thereon, said first surface substantially parallel to said second surface, the apparatus comprising:
   a first metalization layer located solely on a first surface of said first crystal blank;
   a second metalization layer located solely on a second surface of said first crystal blank;
   a third metallization layer located solely on a first surface of said second crystal blank;
   a fourth metalization layer located on a second surface of said second crystal blank;
   a first conductive lead;
   first electrical coupling means for electrical coupling said first conductive lead to said first metalization layer;
   a second conductive lead;
   second electrical coupling means for electrical coupling said second conductive lead to said fourth metalization layer; and
   mounting means for physically separating said first crystal blank from said second crystal blank in a manner which maintains said first crystal blank in a plane substantially parallel to said second crystal blank, said mounting means comprising an insulating partition having at least one aperture formed therein, said insulating partition substantially insulating said first crystal blank vibrationally from said second crystal blank while allowing for electrical coupling said second metalization layer to said third metalization layer at said first or second nodes of said first and second crystal blanks through said at least one aperture.

2. The apparatus of claim 1 wherein said mounting means further comprises:

first spacer means for separating said first crystal blank from said insulating partition, said first spacer means contacting said first crystal blank at said first nonvibrating node;

second spacer means for separating said first crystal blank from said insulating partition, said second spacer means contacting said first crystal blank at said second nonvibrating node;

third spacer means for separating said second crystal blank from said insulating partition, said third spacer means contacting said second crystal blank at said first nonvibrating node; and fourth spacer means for separating said second crystal blank from said insulating partition, said fourth spacer means contacting said second crystal blank at said second nonvibrating node.

3. The apparatus of claim 2 wherein said insulating partition has physical dimensions substantially similar to said first crystal blank and wherein said first crystal blank, said second crystal blank, and said insulating partition are concentric one to another.

4. The apparatus of claim 1 wherein said insulating partition comprises electrical coupling means for coupling said second metalization layer to said third metalization layer.

5. The apparatus of claim 2 wherein said at least one aperture is located on said insulating partition substantially between said first spacer means and said third spacer means and wherein said first spacer means comprises electrically conductive material and said third spacer means comprises electrically conductive material such that said second metalization layer electrically couples to said third metalization layer via said first spacer means and said third spacer means through said at least one aperture.

6. Dual mounted crystal filter blanks for coupling to a first wire and a second wire comprising:

a first crystal blank having a first metalization layer on a first surface and a second metalization layer on a second surface of said first crystal blank, said second surface opposite and parallel to said first surface, and having a first node and a second node wherein contact with said first crystal blank at either said first node or said second node minimizes vibrational interference therewith;

a second crystal blank having a first metalization layer on a first surface and a second metalization layer on a second surface, said second surface opposite and parallel to said first surface, and having a first node and a second node wherein contact with said second crystal blank at either said first node or said second node minimizes vibrational interfenrce therewith;

first coupling means for coupling said first wire to said first metalization layer of said first crystal blank at said first node of said first crystal blank;

second coupling means for coupling said second wire to said second metalization layer of said second crystal blank at said second node of said second crystal blank;

first mounting means coupled to said first and second nodes of said first crystal blank for mounting said first crystal blank;

second mounting means coupled to said first and second nodes of said second crystal blank for mounting said second crystal blank; and insulating means for electrically insulating and physically separating said first crystal blank from said second crystal blank to minimize electrical and vibrational interference therebetween, said insulating means formed to maintain said first crystal blank and said second crystal blank in a first and a second plane substantially parallel one to another while allowing electrical coupling therethrough of said second metalization layer of said first crystal blank to said first metalization layer of said second crystal blank.

7. The apparatus of claim 6 wherein said insulating means further maintains said first crystal blank and said second crystal blank concentric to one another and concentric to said insulating means.

* * * * *